US009318998B1

(12) United States Patent
Tabrizian et al.

(10) Patent No.: US 9,318,998 B1
(45) Date of Patent: Apr. 19, 2016

(54) ACOUSTICALLY-ENGINEERED MULTI-PORT PIEZOELECTRIC-ON-SEMICONDUCTOR RESONATORS FOR ACCURATE TEMPERATURE SENSING AND REFERENCE SIGNAL GENERATION

(71) Applicant: Georgia Tech Research Corporation, Atlanta, GA (US)

(72) Inventors: Roozbeh Tabrizian, Atlanta, GA (US); Farrokh Ayazi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 84 days.

(21) Appl. No.: 14/015,707

(22) Filed: Aug. 30, 2013

(51) Int. Cl.
*H03B 5/32* (2006.01)
*H01L 41/09* (2006.01)
*H03B 5/04* (2006.01)
*H03L 1/02* (2006.01)
*H03B 21/00* (2006.01)
*H03B 5/30* (2006.01)

(52) U.S. Cl.
CPC .............. *H03B 5/323* (2013.01); *H01L 41/09* (2013.01); *H03B 5/04* (2013.01); *H03B 5/30* (2013.01); *H03B 5/32* (2013.01); *H03B 21/00* (2013.01); *H03L 1/02* (2013.01); *H03L 1/021* (2013.01); *H03L 1/022* (2013.01); *H03L 1/027* (2013.01); *H03L 1/028* (2013.01)

(58) Field of Classification Search
CPC .......... H03L 1/02; H03L 1/021; H03L 1/022; H03L 1/027; H03L 1/028; H03B 5/30; H03B 5/32; H03B 21/00; H03B 5/04; H01L 41/09

USPC ....... 331/2, 37, 38, 41, 46, 66, 116 R, 116 M, 331/154, 155, 156, 163, 176; 333/186, 189, 333/197
See application file for complete search history.

(56) References Cited

U.S. PATENT DOCUMENTS 3,490,056 A * 1/1970 Milton et al. ............... 333/186
5,200,714 A * 4/1993 Hayashi ................. H03L 1/028
    310/315
7,312,674 B2 * 12/2007 Duwel et al. ............... 333/186

(Continued)

OTHER PUBLICATIONS

Dalal, M.J. et al.; Simultaneous Dual-Mode Excitation of Piezo-On-Silicon Micromechanical Oscillator for Self-Temperature Sensing; Georgia Institute of Technology, Atlanta, Georgia, USA; Published in Micro Electro Mechanical Systems (MEMS), 2011 IEEE 24th International Conference; ISSN: 1084-6999; 4 pages.

(Continued)

*Primary Examiner* — Richard Tan
(74) *Attorney, Agent, or Firm* — Myers Bigel & Sibley, P.A.

(57) ABSTRACT

An integrated circuit device includes a multi-port piezoelectric-on-semiconductor microelectromechanical resonator, which is configured to support independent and concurrent piezoelectric transduction of multiple resonance modes. The resonator includes a semiconductor resonator body (e.g., Si body) suspended opposite an underlying recess in a substrate. Opposite ends of the semiconductor resonator body are anchored to the substrate. The resonator body may be formed so that a plan layout view of a portion of the semiconductor resonator body is dumbbell-shaped to thereby support acoustic energy trapping of multiple high-Q resonance modes.

22 Claims, 15 Drawing Sheets

(56) References Cited

U.S. PATENT DOCUMENTS

| | | | |
|---|---|---|---|
| 7,443,258 B2* | 10/2008 | Hagelin | 331/156 |
| 8,456,275 B2 | 6/2013 | Zimmermann et al. | |
| 8,497,747 B1* | 7/2013 | Wojciechowski | H03H 9/0095 310/366 |
| 2010/0315170 A1* | 12/2010 | Locascio et al. | 331/15 |

OTHER PUBLICATIONS

Vig, John R.; Temperature-Insensitive Dual-Mode Resonant Sensors—A Review; IEEE Sensors Journal, vol. 1, No. 1, Jun. 2001; pp. 62-68.

* cited by examiner $$W_{2i+1} \geq W_{2i} \geq W_{2i+2}$$
$$\text{and} \qquad i = 0, 1, \cdots$$
$$W_{2i+3} \geq W_{2i+1} \geq W_{2i}$$

$$W_{2i+1} \leq W_{2i} \leq W_{2i+2}$$
$$\text{and} \qquad i = 0, 1, \cdots$$
$$W_{2i+3} \leq W_{2i+1} \leq W_{2i}$$

$$W_{2i+1} \leq W_{2i} \leq W_{2i+2}$$
and
$$W_{2i+3} \leq W_{2i+1} \leq W_{2i}$$

$$V_{2i+1} \leq V_{2i} \leq V_{2i+2}$$
and
$$V_{2i+3} \leq V_{2i+1} \leq V_{2i}$$

ACOUSTICALLY-ENGINEERED MULTI-PORT PIEZOELECTRIC-ON-SEMICONDUCTOR RESONATORS FOR ACCURATE TEMPERATURE SENSING AND REFERENCE SIGNAL GENERATION

FIELD OF THE INVENTION

The present invention relates to integrated circuit devices and, more particularly, to microelectromechanical resonator devices.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMs) resonators can provide small form factor, ease of integration with conventional semiconductor fabrication techniques and high f·Q products. Accordingly, MEMs resonators are considered a desirable alternative to quartz resonators in real-time and other clock applications.

One category of MEMs resonators includes lateral-mode piezoelectric resonators, such as thin-film piezoelectric-on-silicon (TPoS) resonators. These resonators utilize piezoelectric transduction to achieve electromechanical coupling using the transverse piezoelectric coefficient $e_{31}$ of a planar piezoelectric layer, such as aluminum nitride (AlN). These types of resonators are disclosed in U.S. Pat. No. 7,939,990 to Wang et al., entitled "Thin-Film Bulk Acoustic Resonators Having Perforated Bodies That Provide Reduced Susceptibility to Process-Induced Lateral Dimension Variations," and in U.S. Pat. No. 7,888,843 to Ayazi et al., entitled "Thin-Film Piezoelectric-on-Insulator Resonators Having Perforated Resonator Bodies Therein," the disclosures of which are hereby incorporated herein by reference. An example of a high frequency vertical bulk acoustic resonator with a relatively large transduction area that utilizes capacitive coupling is disclosed in U.S. Pat. No. 7,176,770 to Ayazi et al., entitled "Capacitive Vertical Silicon Bulk Acoustic Resonator," the disclosure of which is hereby incorporated herein by reference.

Additional examples of MEMs resonators, which provide electromechanical coupling using the transverse piezoelectric coefficient $e_{31}$ of a planar piezoelectric layer and include active frequency tuning, are disclosed in U.S. Pat. Nos. 7,639,105 and 7,843,284 to Ayazi et al., entitled "Lithographically-Defined Multi-Standard Multi-Frequency High-Q Tunable Micromechanical Resonators," and in U.S. Pat. No. 7,924,119 to Ayazi et al., entitled Micromechanical Bulk Acoustic Mode Resonators Having Interdigitated Electrodes and Multiple Pairs of Anchor Supports," and in U.S. Pat. No. 7,800,282 to Ayazi et al., entitled Single-Resonator Dual-Frequency Lateral-Extension Mode Piezoelectric Oscillators, and Operating Methods Thereof," the disclosures of which are hereby incorporated herein by reference. MEMs resonators, which support actuation and sensing through a longitudinal piezoelectric effect, are also disclosed in U.S. Pat. No. 8,519,598 to Ayazi et al., the disclosure of which is hereby incorporated herein by reference.

Efforts have also been made to utilize these MEMs resonators in temperature-compensated and oven-controlled quartz crystal oscillator (TCXO and OCXO) markets. However, given the relatively large temperature sensitivity of silicon resonators compared to their quartz crystal counterparts, realization of high frequency stabilities over a large temperature range typically requires highly accurate and continuous temperature monitoring of the resonator to thereby apply proper pulling and/or temperature control, which can compensate for temperature-induced frequency drifts. Unfortunately, accurate CMOS temperature sensing solutions typically impose excessive power consumption and complexity. And, because they are often physically separate and thermally isolated from the micromechanical frequency reference, such CMOS-based techniques are prone to offset and delay in temperature monitoring of the resonator, which can result in frequency drifts exceeding instability tolerances.

Accordingly, device-level temperature sensing techniques have been developed. For example, dual-mode quartz crystal and MEMs resonant temperature sensors have been designed and implemented using a higher tone of the main resonance mode along with the first tone to generate a small beat frequency with large temperature sensitivity. One example a of dual-mode MEMs-based oscillator is disclosed in an article by M. J Dalal et al., entitled "Simultaneous Dual-Mode Excitation of Piezo-On-Silicon Micromechanical Oscillator For Self-Temperature Sensing," IEEE MEMS 2011, Cancun, Mexico, January 2011, pp. 489-492. However, these techniques may be limited by the relatively small TCF variation of different tones of a resonance mode. Moreover, similar particle polarization and/or common electrical transduction ports used for excitation and sensing of both modes may result in destructive mechanical and/or electrical interference when a device operates in two oscillation loops simultaneously.

SUMMARY OF THE INVENTION

An integrated circuit device according to embodiments of the invention includes a multi-port piezoelectric-on-semiconductor microelectromechanical resonator, which is configured to support independent and concurrent piezoelectric transduction of multiple resonance modes. According to some embodiments of the invention, the resonator includes a semiconductor resonator body (e.g., Si body) suspended opposite an underlying recess in a substrate. Opposite ends of the semiconductor resonator body are anchored to the substrate. The resonator body may be formed so that a plan layout view of a portion of the semiconductor resonator body is dumbbell-shaped to thereby support acoustic energy trapping of multiple high-Q resonance modes. In still further embodiments of the invention, the plan layout view of the semiconductor resonator body is in the shape of a multi-weight dumbbell, a plan layout view of a centermost portion of the semiconductor resonator body is rectangular-shaped and a width of each of a pair of tethers that anchor the semiconductor resonator body to the substrate is at least 0.75 times and, more preferably, at least 0.9 times a width of the centermost portion of the semiconductor resonator body. The resonator may also include a common input electrode extending along a longitudinal axis of the semiconductor resonator body, a first output electrode having a first pair of electrode fingers that extend adjacent opposite sides of the common input electrode and a second output electrode having a second pair of electrode fingers that extend adjacent respective ones of the first pair of electrodes.

Additional embodiments of the invention include a multi-mode oscillator having a multi-port piezoelectric-on-semiconductor microelectromechanical resonator therein. This resonator is configured to support concurrent piezoelectric transduction of multiple resonance modes. The resonator includes a common input electrode and first and second output electrodes, which are electrically isolated from each other. A temperature sensing control circuit is provided, which is electrically connected to the common input electrode and the first and second output electrodes. The temperature sensing control circuit is configured to generate a beat frequency signal from a combination of the multiple resonance modes detected at the first and second output electrodes. This combination may be an integer linear combination. The temperature sensing control circuit may also include first and second amplifiers having respective input terminals electrically coupled to the common input electrode. At least one of the first and second amplifiers may include an output terminal electrically coupled to a corresponding one of the first and second output electrodes. The first output electrode may include a first pair of electrode fingers that extend adjacent opposite sides of the common input electrode and the second output electrode may include a second pair of electrode fingers that extend adjacent respective ones of the first pair of electrodes.

A multi-mode oscillator according to still further embodiments of the invention includes a multi-port piezoelectric-on-semiconductor microelectromechanical resonator configured to support concurrent piezoelectric transduction of multiple resonance modes. This resonator includes a common input electrode and at least first, second and third output electrodes, which are electrically isolated from each other. A temperature sensing control circuit is also provided, which is electrically connected to the common input electrode and the first and second output electrodes. The temperature sensing control circuit is configured to generate a beat frequency signal from a combination of the multiple resonance modes detected at the first and second output electrodes. This beat frequency signal may have a linear temperature characteristic over a wide temperature range and a relatively large temperature coefficient of frequency (TCF) (e.g., >5000 ppm/° C.). A reference oscillator is also provided, which is configured to generate a periodic reference signal in response to a signal generated at the third output electrode of the resonator. The temperature sensing control circuit may include a tuning network, which is configured to generate a tuning signal and the reference oscillator may be responsive to the tuning signal. According to some of these embodiments of the invention, the temperature sensing control circuit includes first and second transimpedance amplifiers having respective input terminals electrically coupled to the common input electrode of the resonator. The reference oscillator may also have an output terminal electrically coupled to the common input electrode. The reference oscillator can include a third transimpedance amplifier, which has an input terminal electrically coupled to the third output electrode of the resonator. According to further embodiments of the invention, the resonator includes a common input electrode and first, second, third and fourth output electrodes, which are electrically isolated from each other. Opposite ends of the semiconductor resonator body can be anchored to the substrate and a plan layout view of a portion of the semiconductor resonator body is preferably dumbbell-shaped. The temperature sensing control circuit may also be configured to generate the beat frequency signal from an integer linear combination of the multiple resonance modes detected at the first and second output electrodes.

DETAILED DESCRIPTION OF EMBODIMENTS

Figure 1A:
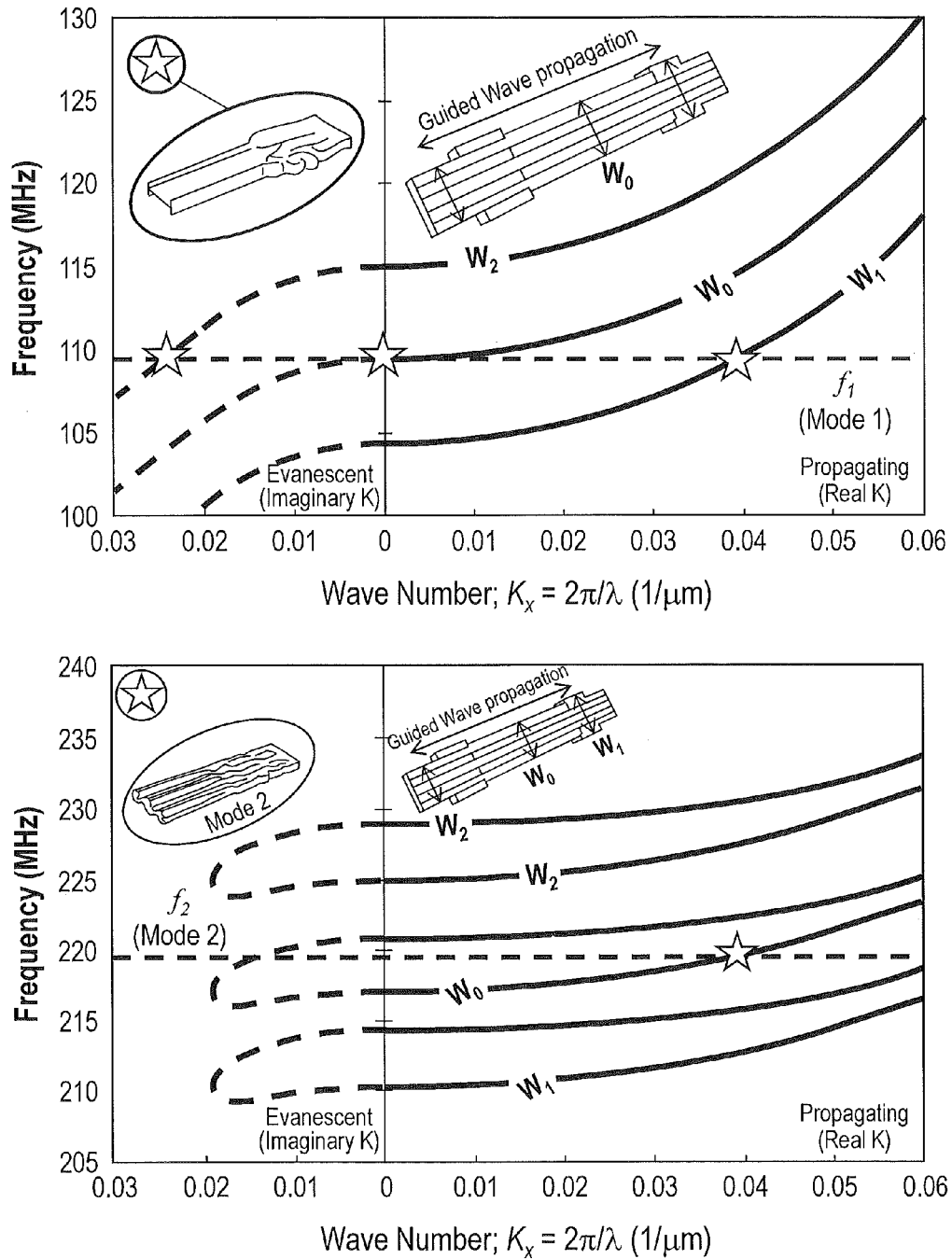
FIG. 1A illustrates dispersion curves for guided waves resulting in modes 1 (in-plane) and 2 (out-of-plane). In mode 1, the $3^{rd}$ width-extensional bulk acoustic mode ($K_x=0$) in the central region ($W_0$) is coupled to the evanescent wave in flanks ($W_2$) through intermediate regions ($W_1$), therefore resulting in acoustic energy trapping in the centermost portion of the resonator. In mode 2, the symmetric out-of-plane wave in the central region (W0) is not supported in the flanks, which imposes an ideally-clamped (as opposed to non-ideal clamping/anchoring of the cavity to the substrate) boundary condition at the two ends of the central region and prevents energy leakage to the substrate.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As described more fully hereinbelow, embodiments of the invention include a silicon microresonator, which is acoustically engineered to facilitate independent piezoelectric transduction of multiple energy-trapped high-Q resonance modes. These modes possess a large temperature coefficient of frequency (TCF) difference and integer frequency ratios, while suppressing other spurious modes. Although not wishing to be bound by any theory, acoustic energy trapping in a central part of a suspended resonator body and far from the substrate can obviate the need for narrow support tethers and thereby facilitate integration of several isolated metallic electrodes on the thin-film piezoelectric transducer, which can be freely routed through wide anchors to separate and electrically isolated ports. These aspects of embodiments of the invention eliminate potentially destructive electrical loading between several oscillator-loops interfaced within an integrated oscillator device and thereby enable the implementation of multiple electrically isolated oscillators using a single MEMs resonator. These multiple oscillators can be advantageously used to generate a beat frequency with very high temperature sensitivity from an integer linear combination of the multiple energy-trapped modes. This beat frequency can then be used to provide accurate device-level temperature sensing. For example, an AlN-on-Silicon microresonator implemented using this technique on a low-resistivity silicon substrate has been shown to support two energy-trapped modes at 109 MHz and 218 MHz, with a large TCF difference of ~7 ppm/° C., which are separately transduced through two isolated electrical ports. A small beat frequency ($f_b$) extracted from a linear combination of these modes was shown to have a linear temperature characteristic over −20° C. to 100° C. with a large TCF of ~8300 ppm/° C.

Figure 1B:
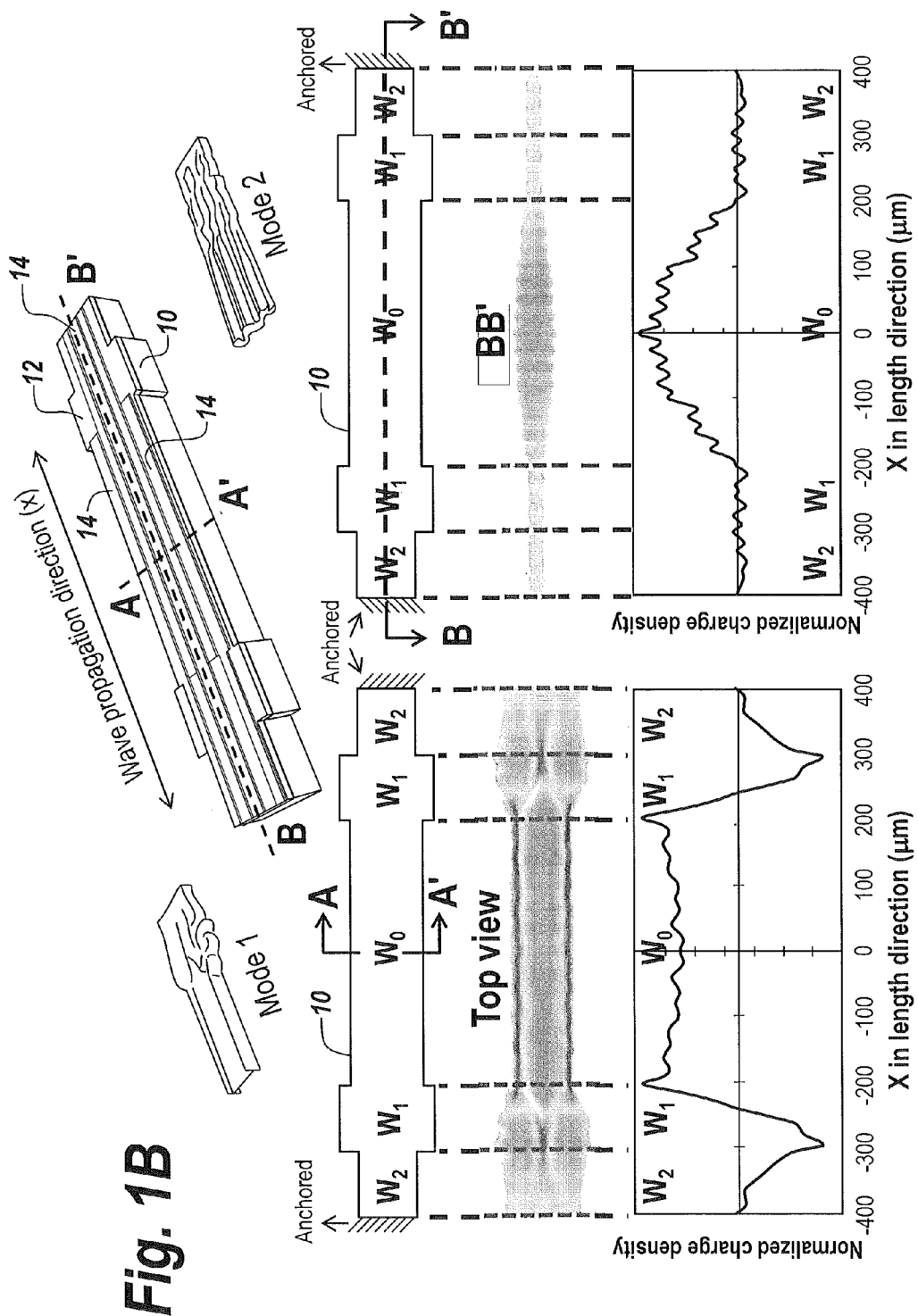
FIG. 1B illustrates a simulated mode shape (A-A' cross-section) and normalized charge density for the two resonance modes (over the B-B' crossing line) showing the effect of acoustic engineering on energy-trapping in the central region.

Referring now to FIGS. 1A-1B, acoustic engineering of the resonator in-plane geometry based on unique dispersion characteristics of guided modes (Modes 1, 2) in single crystal silicon (SCS) wave-guides has been developed to provide several in-plane and out-of-plane modes, which have their energy trapped in the central part of the suspended semiconductor "dumbbell-shaped" resonator body 10 having a piezoelectric layer 12 (e.g., aluminum nitride) and input/output electrodes 14 thereon, where the widths of the illustrated resonator body regions meet the following relationship: $W_1 > W_0 \geq W_2$ (e.g., $W_0 \geq W_2 \geq 0.75\ W_0$). This central energy trapping eliminates the typical requirement of using relatively narrow tethers to anchor the suspended resonator body 10 to a surrounding substrate 20, and thereby provides a relatively wide routing path for several isolated electrodes 14 (e.g., Molybdenum (Mo) electrodes), as shown by the SEM image of FIG. 2B. The use of relatively wide tethers also operates to suppress a large number of spurious modes by distributing their energy density across the entire length of the resonator body rather than in the central region and thereby greatly increasing their energy leakage into the surrounding substrate.

Furthermore, by opting for proper resonator body thickness, energy-trapped out-of-plane resonant modes with integer-fold frequencies of any in-plane extensional mode can be efficiently excited, with some of them showing very large TCF differences when the device is implemented in ultra-low resistivity (100) silicon substrates and aligned to a <110> crystallographic direction. These differences are a result of dissimilar temperature characteristics of different stiffness coefficients of single crystal silicon. As a consequence of the integer frequency ratios and large TCF difference, a beat frequency $f_b$ with very high temperature sensitivity can be generated from an integer (rather than fractional) linear combination of multiple ones of these modes using relatively simple oscillator circuitry as shown by FIG. 2A, which avoids excessive complexity and noise.

Figure 2A:
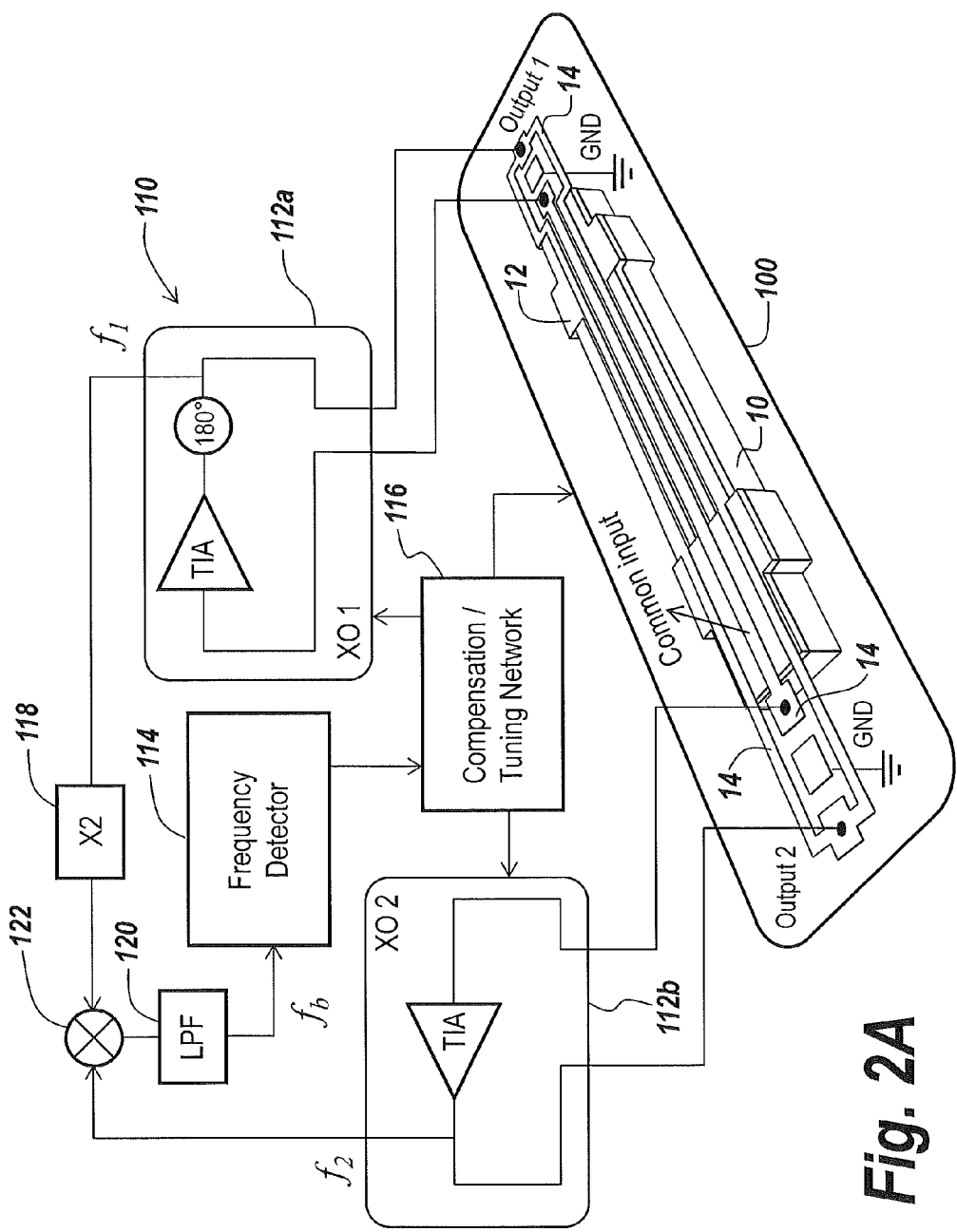
FIG. 2A is an electrical schematic of a temperature stable dual-mode oscillator, which can be used in crystal-oscillator applications (e.g., TCXO, OCXO and MCXO) by exploiting self-temperature sensing through beat frequency generation.
Figure 6:
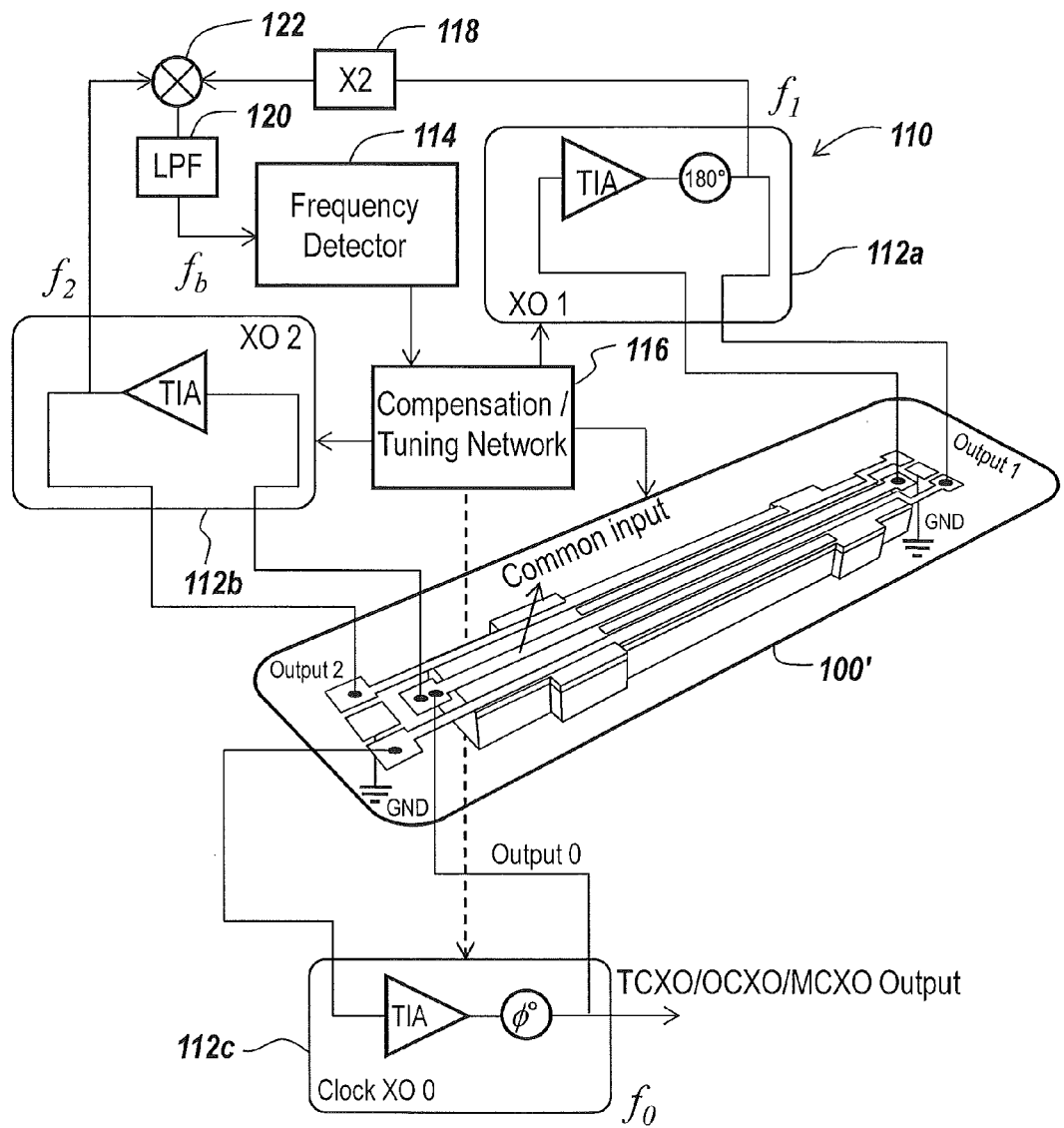
FIG. 6 is an electrical schematic of a temperature stable multi-mode oscillator, according to an embodiment of the present invention.
Figure 7A:
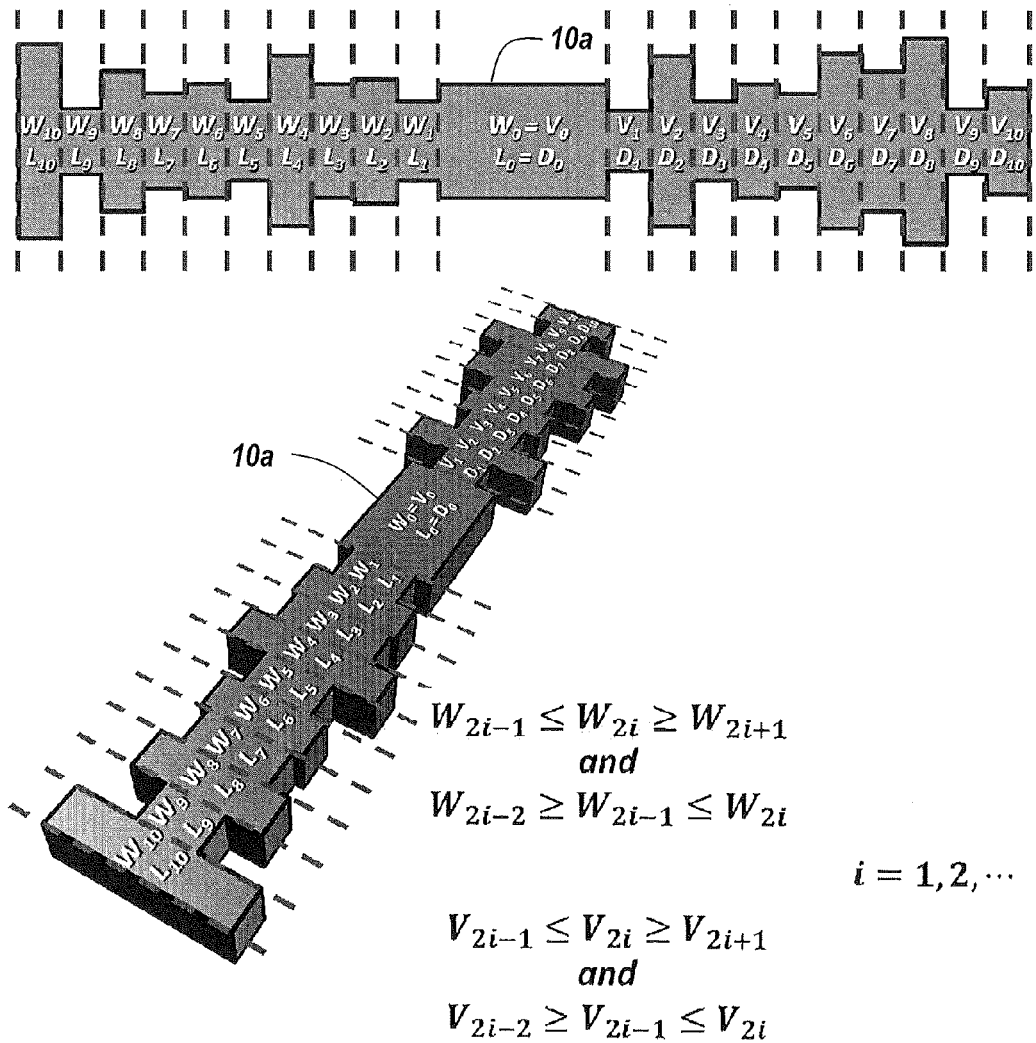
FIGS. 7A-7F are plan and perspective views of symmetric and asymmetric multi-weight dumbbell-shaped resonator bodies having varying widths (W, V) and varying lengths (L, D), according to embodiments of the invention.
Figure 7B:
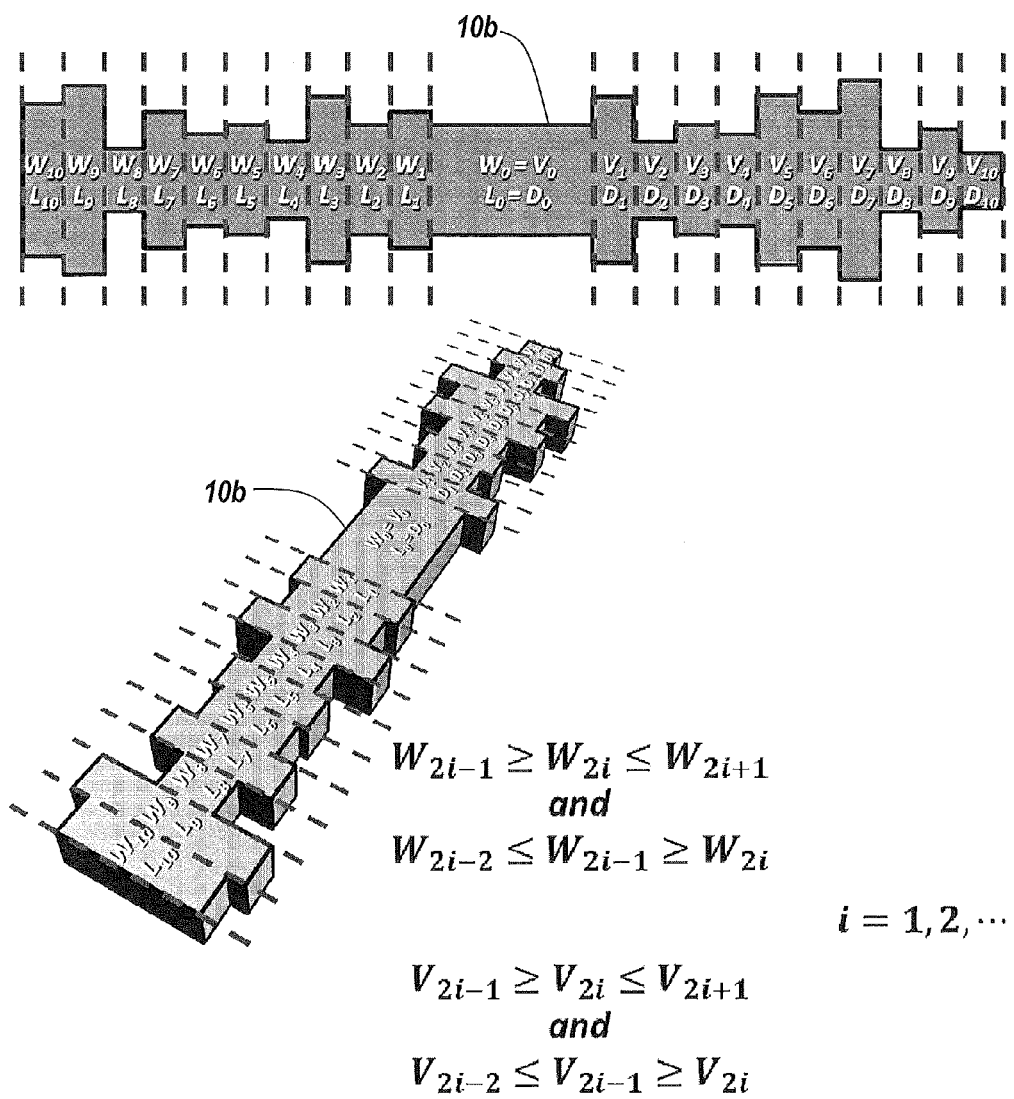
Figure 7C:
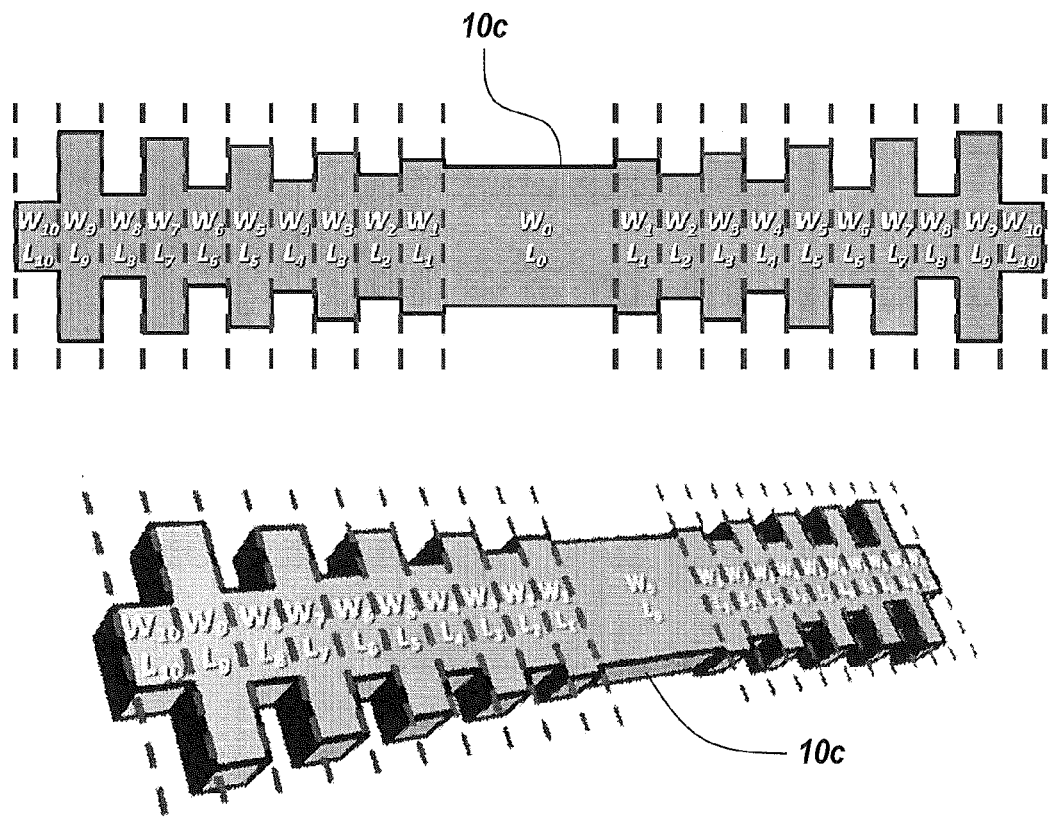
Figure 7D:
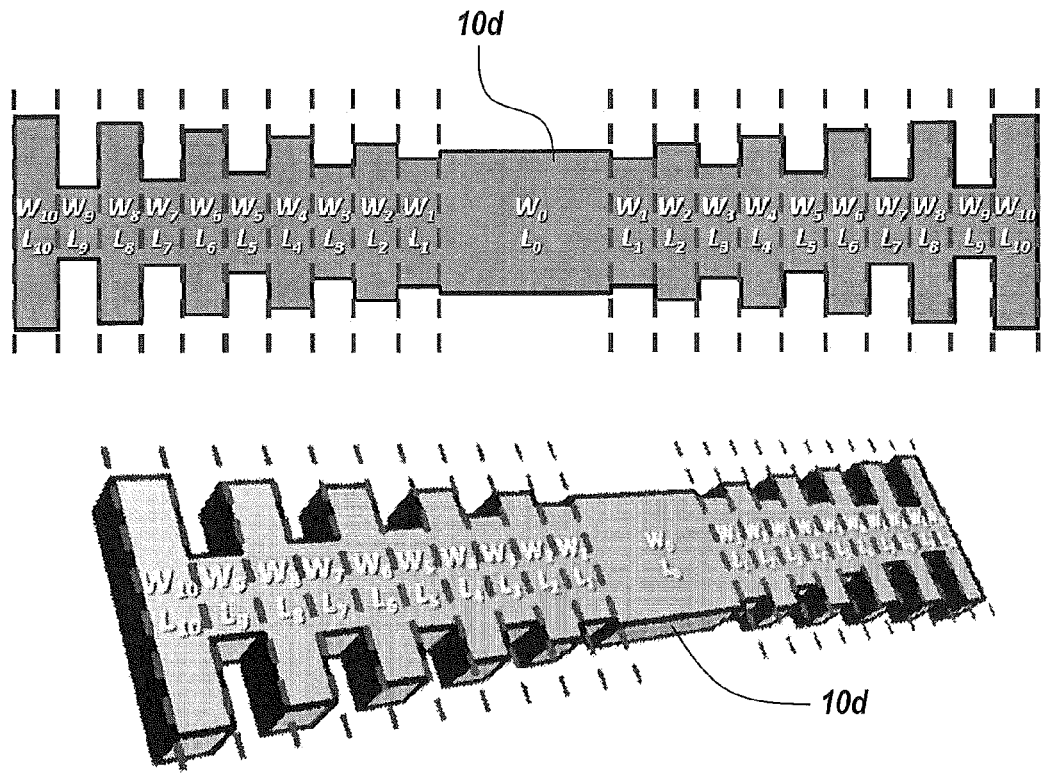
Figure 7E:
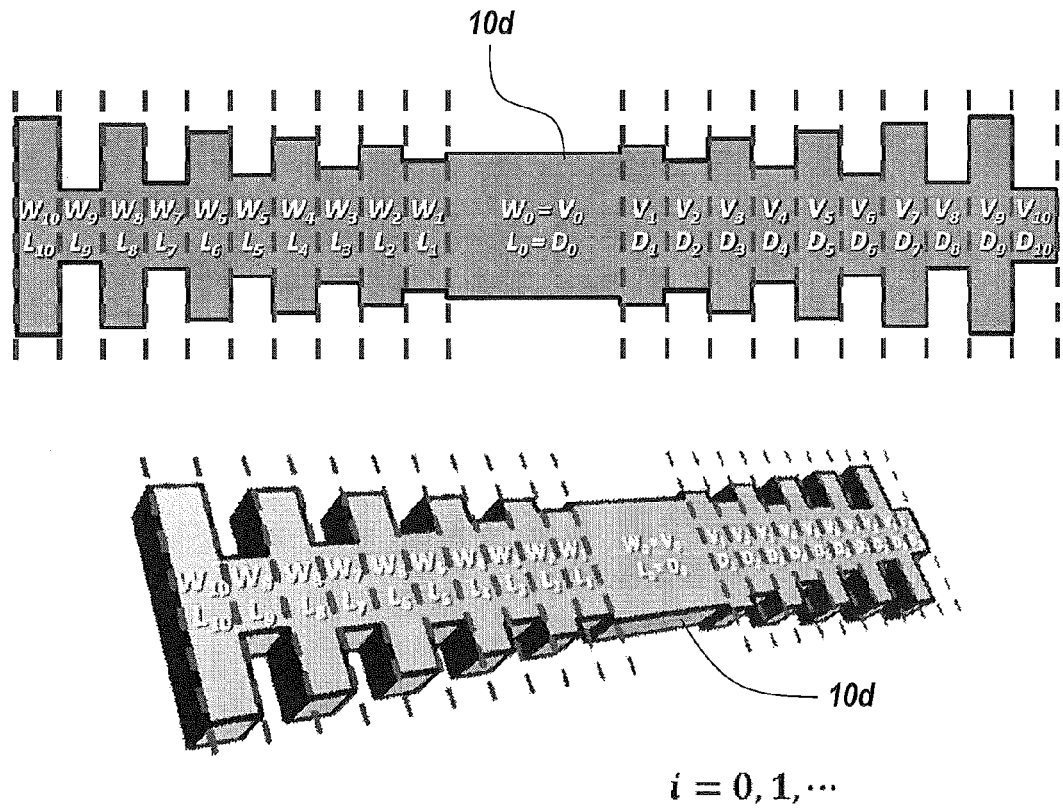
Figure 7F:
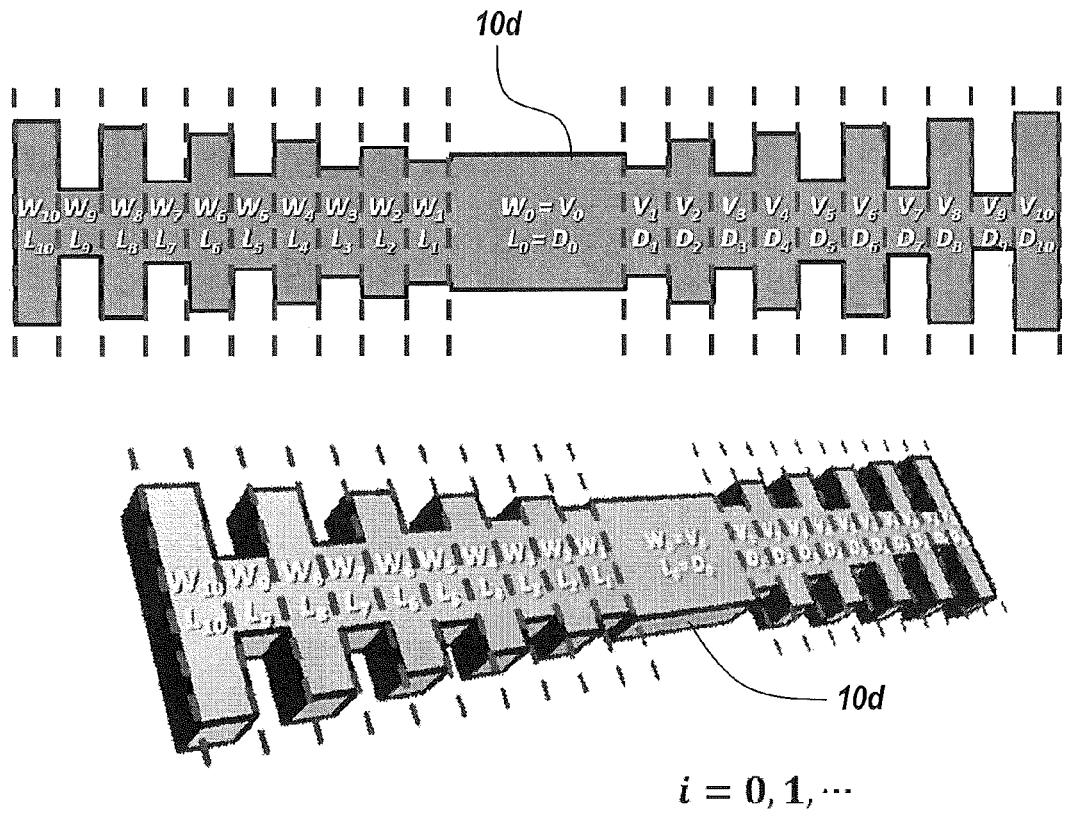

In particular, FIG. 2A illustrates a multi-port piezoelectric-on-semiconductor microelectromechanical resonator 100, which is electrically coupled to a temperature sensing control circuit 110. This control circuit 110 includes first and second transimpedance-based amplifiers 112a, 112b configured to generate frequencies $f_1$ and $f_2$ having integer frequency ratios, a ×2 multiplier 118, a mixer 122, a low pass filter 120, a frequency detector 114 and a temperature compensation and tuning network 116, connected as illustrated. Similarly, FIG. 6 illustrates a modified multi-port piezoelectric-on-semiconductor microelectromechanical resonator 100' having a common input electrode and four (4) electrically isolated output electrodes. A reference oscillator 112c is also included, which is responsive to tuning signal generated by the temperature compensation and tuning network 116. This reference oscillator 112c can be utilized to generate a reference frequency $f_O$ output signal with a relatively high degree of insensitivity to temperature variations within the resonator 100'. In this manner, multiple electrically isolated oscillators can be implemented using a single device, which supports highly accurate resonator-level temperature sensing for temperature-compensated (TC) and oven-controlled (OC) MEMS oscillators requiring ultra-high temperature stabilities.

Figure 2B:
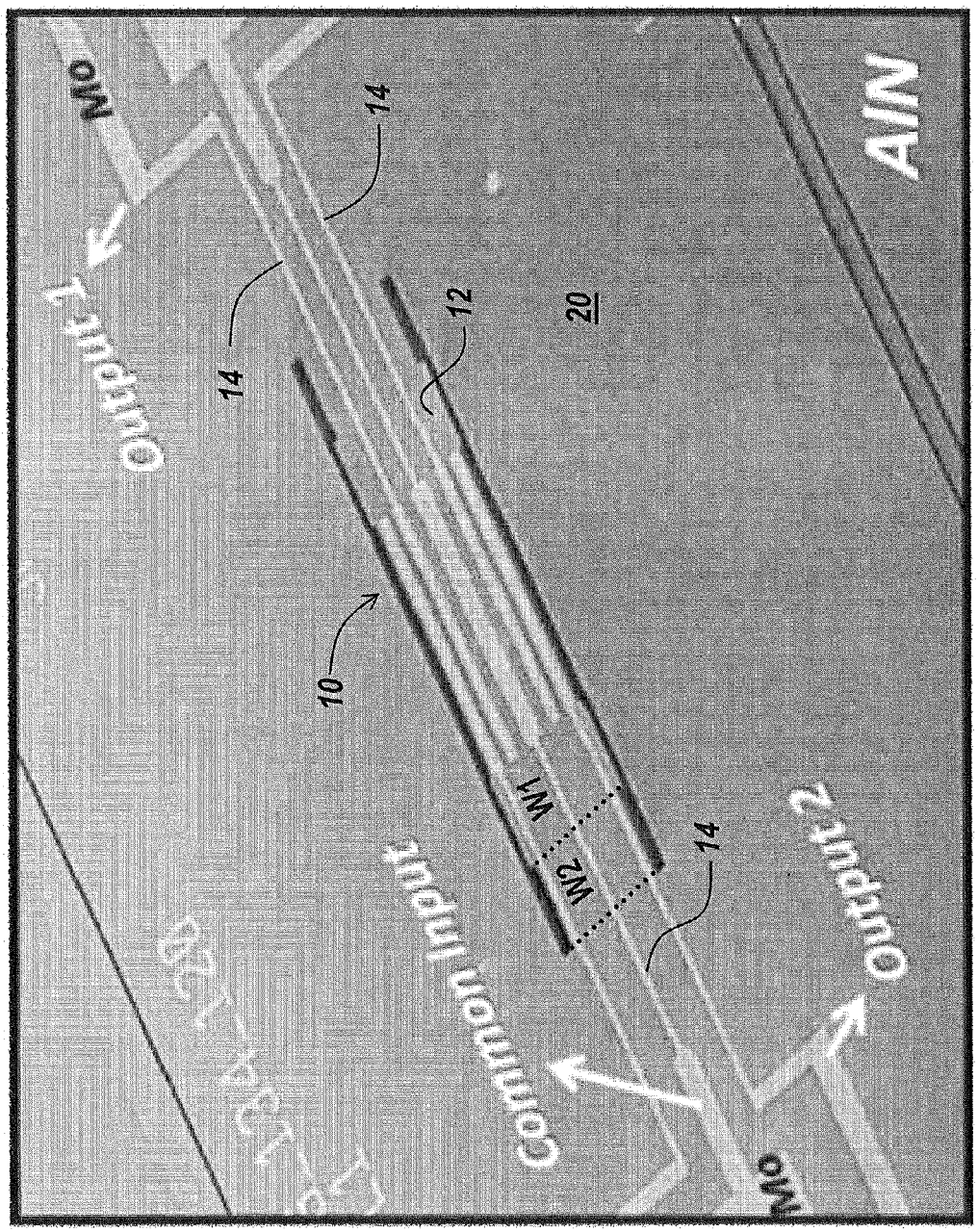
FIG. 2B is an scanning electron microscope (SEM) image of a single-input dual-output AlN-on-Si resonator implemented on a low resistivity substrate, which shows a suspended resonator body engineered to trap acoustic engineering in a centermost portion and facilitate wide anchoring of opposing ends of the resonator body to a surrounding substrate and multiple electrodes routed through wide supports toward electrically isolated ports.
Figure 3:
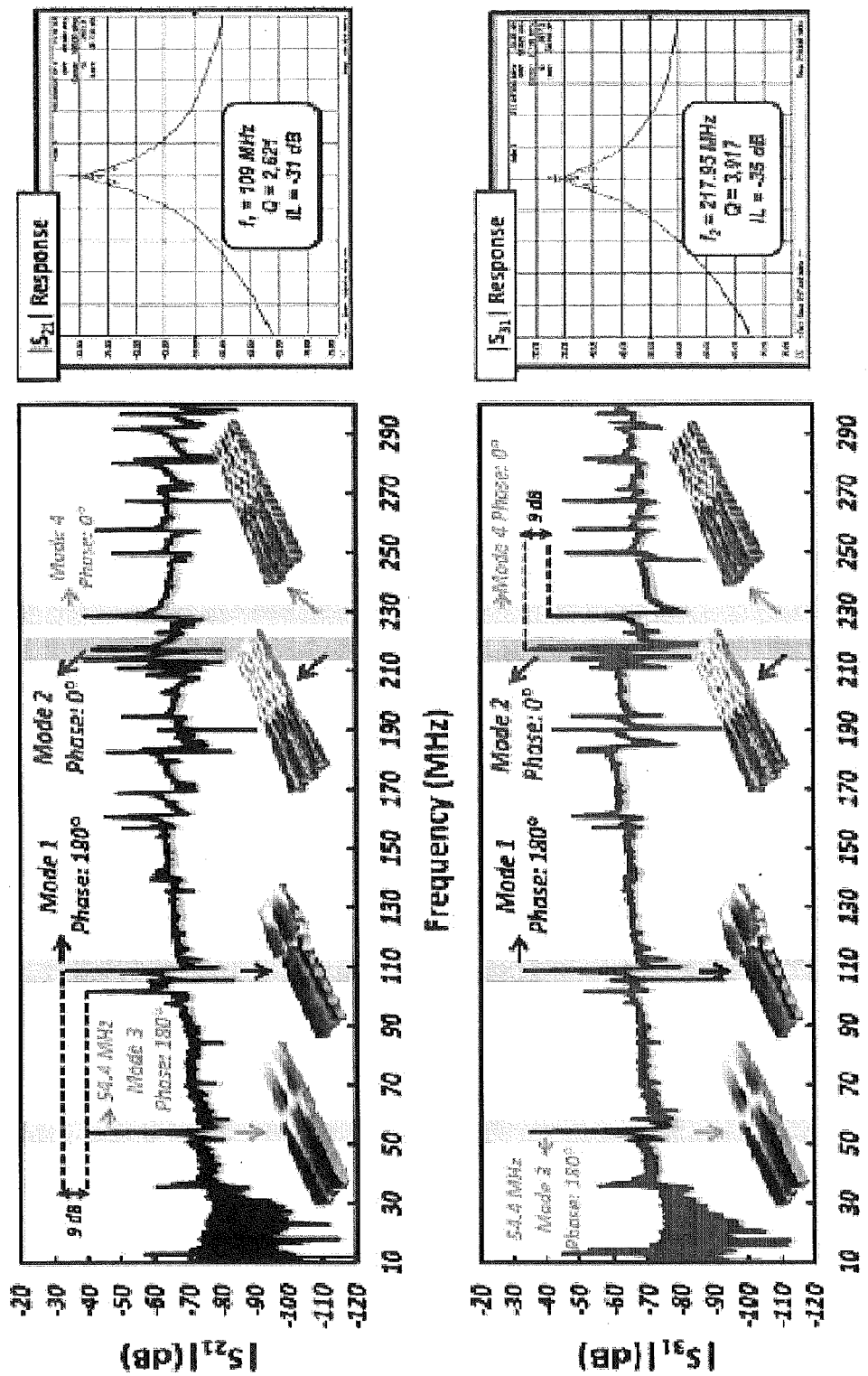
FIG. 3 illustrates measured large-span (left) and short-span screen shot (right) of the frequency response for $S_{21}$ and $S_{31}$. Energy-trapped modes, which include mode 1 and 2 used to generate a beat frequency, are highlighted in the large-span frequency response. Efficient spurious suppression in addition to proper electrode configuration resulting in 180° phase-difference at two modes facilitate implementation of separate oscillators for modes 1 and 2.
Figure 4A:
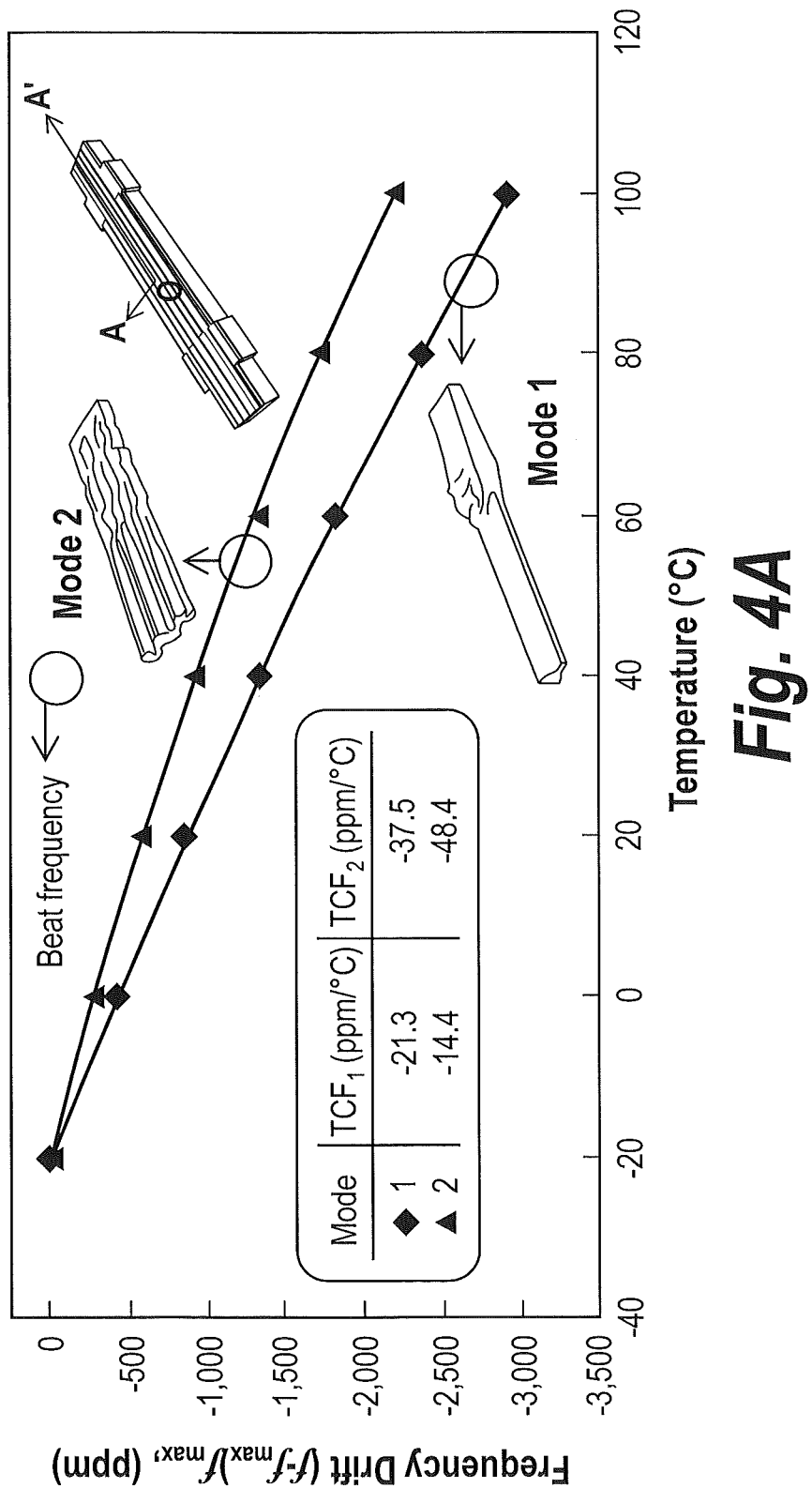
FIGS. 4A-4B are graphs that illustrate measured temperature characteristics of the resonance frequency for modes 1 and 2 showing ~7 ppm/° C. $TCF_1$ difference between them and the temperature characteristics of the beat frequency extracted from an integer linear combination of modes 1 and 2.
Figure 4B:
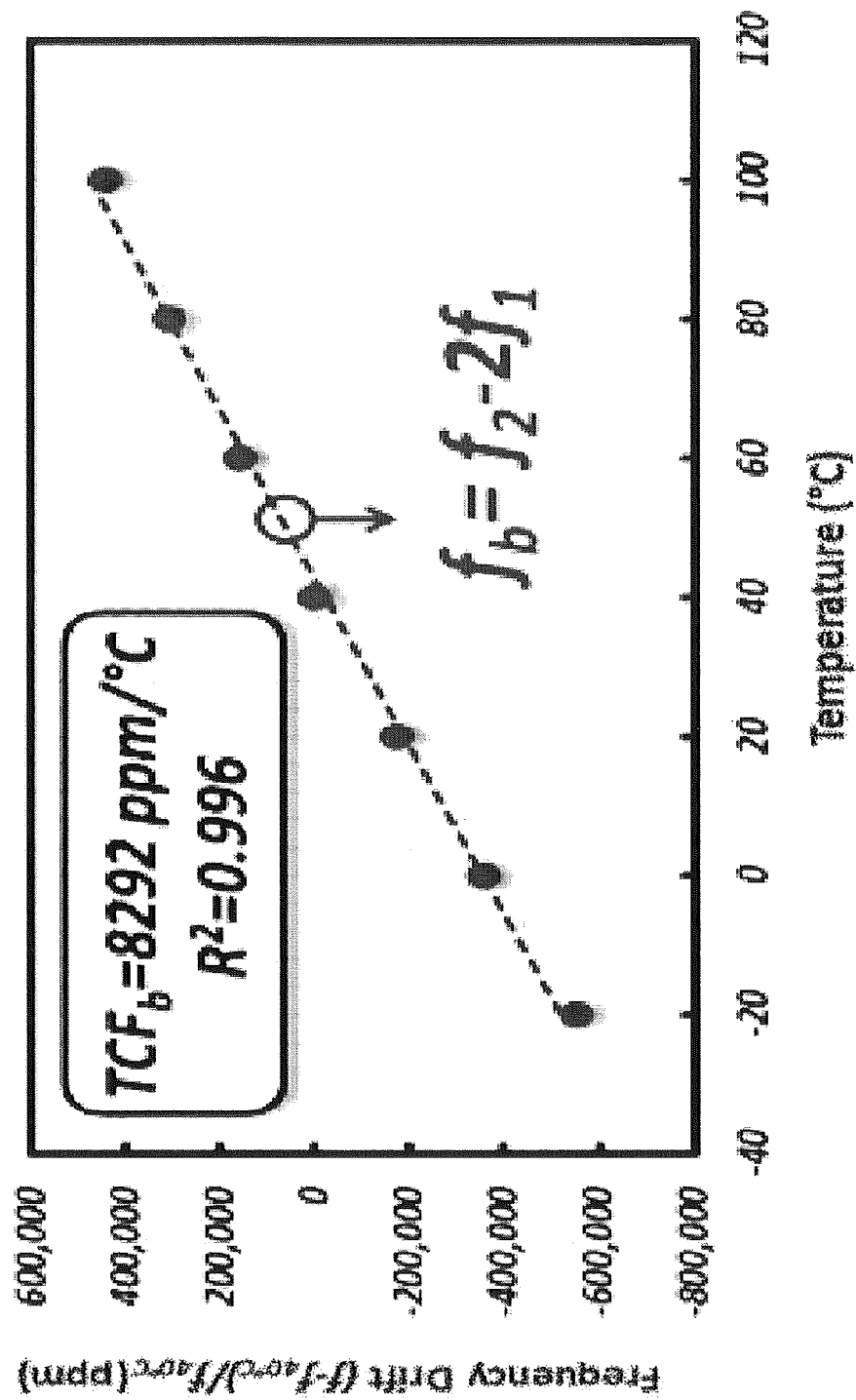
Figure 5:
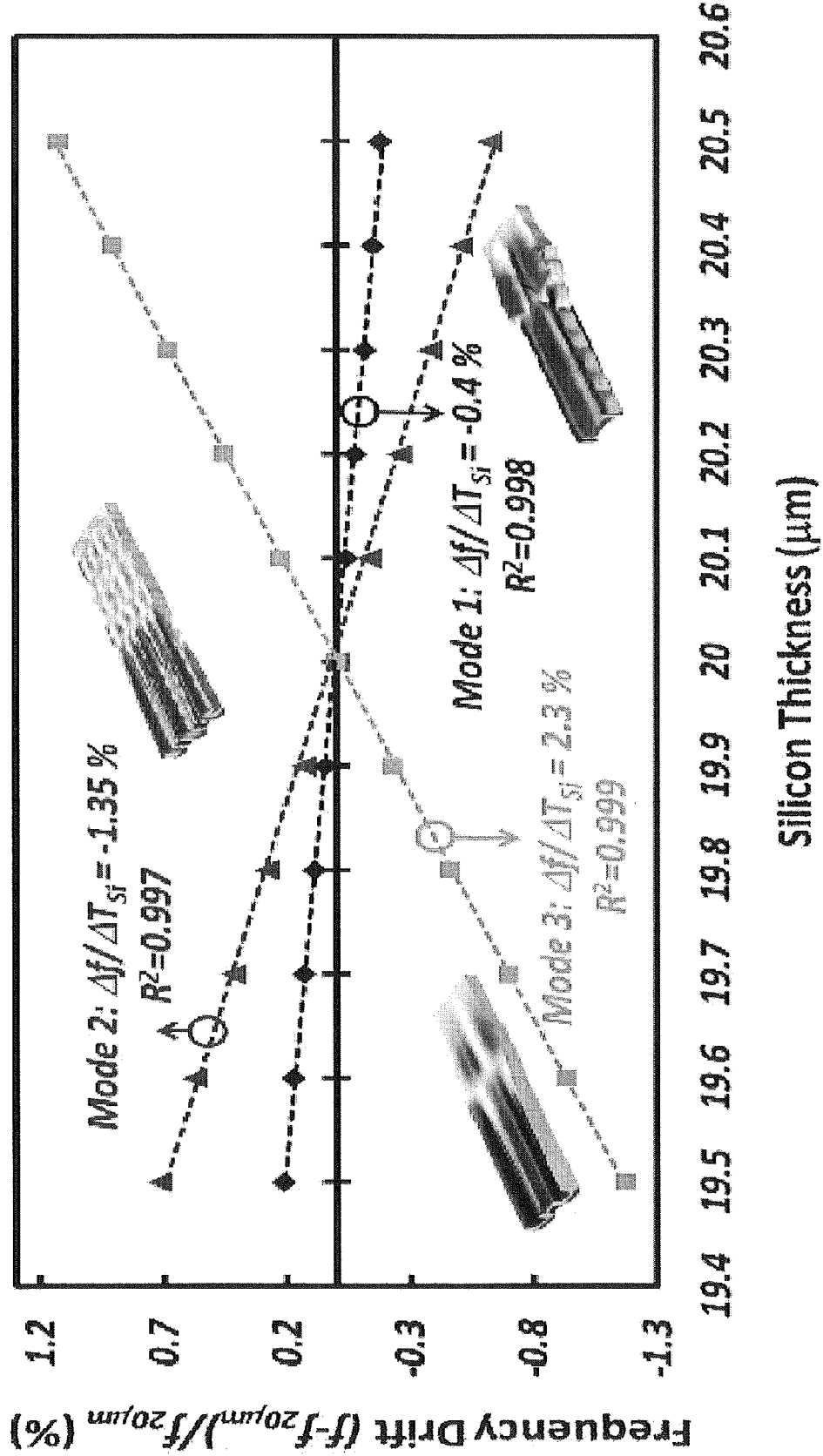
FIG. 5 is a graph of simulated frequency drifts of the resonance modes 1, 2 and 3 over a thickness variation of ±0.5 um around silicon thickness (20 um) showing different trends for two out-of-plane modes (2 and 3), which shows the feasibility of process variation compensation for the beat frequency by generating the $f_b$ from a linear combination of the three modes (instead of two modes) because of the integer frequency ratios between all modes: $f_2=2f_1=4f_3$.

The SEM image of a three port resonator (single-input, double-output) of FIG. 2B, which was acoustically engineered to have two energy-trapped modes, among others, at 109 MHz (in-plane mode 1) and 218 MHz (out-of-plane mode 2) with respective quality factors (Qs) of 2,600 and 4,000 (measured in air) as shown by FIG. 3, illustrates an embodiment of a preferred dumbbell shape of a suspended resonator body 10 (opposite an underlying recess). As shown, the acoustic engineering within the dumbbell-shaped resonator body 10 as well as the illustrated configuration of the electrically isolated input/output electrodes 14, can be exploited to support efficient transduction of energy-trapped modes 1 and 2, while considerably suppressing other modes to >9 dB higher insertion-loss levels. FIG. 4A shows the temperature characteristics of the modes, with a measured linear TCF ($TCF_1$) of −21.3 ppm/° C. and −14.4 ppm/° C. for in-plane mode 1 and out-of-plane mode 2, respectively, which provides a large difference of ~7 ppm/° C. The beat frequency extracted from the modes ($f_b=f_2-2f_1$) shows a linear temperature characteristic with a TCF of ~8300 ppm/° C., as shown by FIG. 4B, which may be the highest temperature sensitivity reported to date for any single-device dual-mode resonant temperature sensor with integer linear combination coefficients. As will be understood by those skilled in the art, although the large sensitivity of the beat frequency may be affected by process uncertainties such as substrate thickness variation, the linear combination of three energy-trapped modes (rather than two) can also be used to considerably compensate for beat frequency value and temperature sensitivity drifts. This can be realized advantageously because of the opposite trend of thickness-dependency for extensional and flexural out-of-plane energy-trapped modes, as highlighted by modes 2 and 3 in FIG. 5.

Moreover, as illustrated by FIGS. 7A-7F, additional dumbbell-shaped resonator bodies 10a-10f having varying symmetric and asymmetric widths (W, V) and varying lengths (L, D) in the shape of a "multi-weight" dumbbell may be used to provide a class of "tether-less" silicon-based MEMS resonators, which are acoustically optimized for efficient energy trapping of different modes with integer-fold frequencies and large TCF difference. As will be understood by those skilled in the art, these resonator bodies 10a-10f may be supported opposite an underlying recess within a microelectronic substrate. The suspension of a rectangular-shaped MEMS resonator body opposite an underlying recess in a microelectronic substrate is also highlighted by U.S. patent application Ser. No. 13/837,854, filed Mar. 15, 2013, the disclosure of which is hereby incorporated herein by reference.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
a multi-port piezoelectric-on-semiconductor microelectromechanical resonator configured to support independent and concurrent piezoelectric transduction of multiple resonance modes, said resonator comprising a semiconductor resonator body, a common input electrode extending along a longitudinal axis of the semiconductor resonator body, a first output electrode having a first pair of electrode fingers that extend adjacent opposite sides of the common input electrode, and a second output electrode having a second pair of electrode fingers that extend adjacent respective ones of the first pair of electrodes, and where a plan perspective of at least a portion of the semiconductor resonator body is dumbbell-shaped;
wherein the semiconductor resonator body is suspended opposite an underlying recess in a substrate; and wherein opposite ends of the semiconductor resonator body are anchored to the substrate.

2. The device of claim 1, wherein a plan layout view of a centermost portion of the semiconductor resonator body is rectangular-shaped.

3. The device of claim 2, wherein a width of each of a pair of tethers that anchor the semiconductor resonator body to the substrate is at least 0.75 times a width of the centermost portion of the semiconductor resonator body.

4. The device of claim 2, wherein a width of each of a pair of tethers that anchor the semiconductor resonator body to the substrate is at least 0.9 times a width of the centermost portion of the semiconductor resonator body.

5. An integrated circuit device, comprising:
a multi-port piezoelectric-on-semiconductor microelectromechanical resonator configured to support independent and concurrent piezoelectric transduction of multiple resonance modes, said resonator comprising a semiconductor resonator body, a common input electrode extending along a longitudinal axis of the semiconductor resonator body, a first output electrode having a first pair of electrode fingers that extend adjacent opposite sides of the common input electrode, and a second output electrode having a second pair of electrode fingers that extend adjacent respective ones of the first pair of electrodes, and where a plan perspective of at least a portion of the semiconductor resonator body is dumbbell-shaped;

wherein the plan perspective of the portion of the semiconductor resonator body is in the shape of a multi-weight dumbbell; and wherein the portion supports energy-trapping of the multiple resonance modes.

6. A multi-mode oscillator, comprising:
a multi-port piezoelectric-on-semiconductor microelectromechanical resonator configured to support concurrent piezoelectric transduction of multiple resonance modes, said resonator comprising a common input electrode extending along a longitudinal axis of a dumbbell-shaped semiconductor resonator body that supports energy-trapping of the multiple resonance modes and first and second output electrodes, which are electrically isolated from each other, said first output electrode comprising a first pair of electrode fingers extending adjacent opposite sides of the common input electrode and said second output electrode comprising a second pair of electrode fingers extending adjacent respective ones of the first pair of electrode fingers; and
a temperature sensing control circuit electrically connected to the common input electrode and the first and second output electrodes, said temperature sensing control circuit configured to generate a beat frequency signal from a combination of the multiple resonance modes detected at the first and second output electrodes.

7. The oscillator of claim 6, wherein said temperature sensing control circuit comprises first and second amplifiers having respective input terminals electrically coupled to the common input electrode.

8. The oscillator of claim 7, wherein at least one of the first and second amplifiers has an output terminal electrically coupled to a corresponding one of the first and second output electrodes.

9. The oscillator of claim 8, wherein said temperature sensing control circuit is configured to generate the beat frequency signal from an integer linear combination of the multiple resonance modes detected at the first and second output electrodes.

10. The oscillator of claim 6, wherein said temperature sensing control circuit is configured to generate the beat frequency signal from an integer linear combination of the multiple resonance modes detected at the first and second output electrodes.

11. A multi-mode oscillator, comprising:
a multi-port piezoelectric-on-semiconductor microelectromechanical resonator configured to support concurrent piezoelectric transduction of multiple resonance modes, said resonator comprising a common input electrode and at least first, second and third output electrodes, which are electrically isolated from each other;
a temperature sensing control circuit electrically connected to the common input electrode and the first and second output electrodes, said temperature sensing control circuit configured to generate a beat frequency signal from a combination of the multiple resonance modes detected at the first and second output electrodes; and
a reference oscillator configured to generate a periodic reference signal in response to a signal generated at the third output electrode of said resonator;
wherein said temperature sensing control circuit comprises a tuning network configured to generate a tuning signal and said reference oscillator is responsive to the tuning signal;

wherein said temperature sensing control circuit comprises first and second transimpedance amplifiers having respective input terminals electrically coupled to the common input electrode; and
wherein said reference oscillator has an output terminal electrically coupled to the common input electrode.

12. The oscillator of claim 11, wherein said reference oscillator comprises a third transimpedance amplifier having an input terminal electrically coupled to the third output electrode of said resonator.

13. The oscillator of claim 11, wherein said temperature sensing control circuit is configured to generate the beat frequency signal from an integer linear combination of the multiple resonance modes detected at the first and second output electrodes.

14. The oscillator of claim 11, wherein said multi-port piezoelectric-on-semiconductor microelectromechanical resonator is configured to support independent and concurrent piezoelectric transduction of the multiple resonance modes.

15. A multi-mode oscillator, comprising:
a multi-port piezoelectric-on-semiconductor microelectromechanical resonator configured to support concurrent piezoelectric transduction of multiple resonance modes, said resonator comprising a common input electrode and at least first, second and third output electrodes, which are electrically isolated from each other;
a temperature sensing control circuit electrically connected to the common input electrode and the first and second output electrodes, said temperature sensing control circuit configured to generate a beat frequency signal from a combination of the multiple resonance modes detected at the first and second output electrodes; and
a reference oscillator configured to generate a periodic reference signal in response to a signal generated at the third output electrode of said resonator
wherein said temperature sensing control circuit is configured to generate the beat frequency signal from an integer linear combination of the multiple resonance modes detected at the first and second output electrodes; and
wherein said resonator comprises:
a semiconductor resonator body suspended opposite an underlying recess in a substrate; and
a common input electrode and first, second, third and fourth output electrodes, which are electrically isolated from each other, on said semiconductor resonator body;
wherein opposite ends of the semiconductor resonator body are anchored to the substrate; and
wherein a plan layout view of a portion of the semiconductor resonator body is dumbbell-shaped.

16. An integrated circuit device, comprising:
a multi-port piezoelectric-on-semiconductor microelectromechanical resonator configured to support independent and concurrent piezoelectric transduction of multiple resonance modes, said resonator comprising a plurality of spaced-apart electrodes that are electrically isolated from each other, on a semiconductor resonator body having a portion therein that is dumbbell-shaped when viewed from a plan perspective, said plurality of spaced-apart electrodes including at least a first electrode extending along a longitudinal axis of the resonator body, a second electrode extending adjacent a first side of the first electrode and a third electrode extending adjacent a second side of the first electrode, which is opposite the first side of the first electrode;

wherein the semiconductor resonator body is suspended opposite an underlying recess in a substrate; wherein opposite ends of the semiconductor resonator body are anchored to the substrate; and wherein a width of each of a pair of tethers that anchor the semiconductor resonator body to the substrate is at least 0.75 times a width of a centermost portion of the semiconductor resonator body.

17. The device of claim 16, wherein said plurality of spaced-apart electrodes include a third output electrode.

18. The device of claim 16, wherein at least one of the second and third electrodes comprises a pair of electrode fingers, which extend on opposite sides of the first electrode.

19. The device of claim 16, wherein the first, second and third electrodes comprise a common input electrode, a first output electrode and a second output electrode, respectively.

20. An integrated circuit device, comprising:
a multi-port piezoelectric-on-semiconductor microelectromechanical resonator configured to support piezoelectric transduction of multiple resonance modes, said resonator comprising a semiconductor resonator body and a plurality of spaced-apart electrodes, which are electrically isolated from each other, on the semiconductor resonator body, said semiconductor resonator body having a portion therein that is suspended opposite an underlying recess in a substrate and is dumbbell-shaped when viewed from a plan perspective;
wherein opposite ends of the semiconductor resonator body are anchored to the substrate; and wherein a width of each of a pair of tethers that anchor the semiconductor resonator body to the substrate is at least 0.75 times a width of a centermost portion of the semiconductor resonator body;
wherein the plurality of spaced-apart electrodes includes a first output electrode extending across a first of the pair of tethers and a second output electrode extending across a second of the pair of tethers.

21. The device of claim 20, wherein the suspended portion of the semiconductor resonator body is in the shape of a multi-weight dumbbell when viewed from the plan perspective.

22. The device of claim 20, further comprising an input electrode extending across the first of the pair of tethers, but not the second of the pair of tethers.

* * * * *